(12) United States Patent
Koshihara et al.

(10) Patent No.: US 10,989,679 B2
(45) Date of Patent: Apr. 27, 2021

(54) TIME-RESOLVED PHOTOEMISSION ELECTRON MICROSCOPY AND METHOD FOR IMAGING CARRIER DYNAMICS USING THE TECHNIQUE

(71) Applicants: TOKYO INSTITUTE OF TECHNOLOGY, Tokyo (JP); INTER-UNIVERSITY RESEARCH INSTITUTE CORPORATION HIGH ENERGY ACCELERATOR RESEARCH ORGANIZATION, Ibaraki (JP)

(72) Inventors: Shinya Koshihara, Tokyo (JP); Keiki Fukumoto, Ibaraki (JP)

(73) Assignees: TOKYO INSTITUTE OF TECHNOLOGY, Tokyo (JP); INTER-UNIVERSITY RESEARCH INSTITUTE CORPORATION HIGH ENERGY ACCELERATOR RESEARCH ORGANIZATION, Ibaraki (JP)

( * ) Notice: Subject to any disclaimer, the term of this patent is extended or adjusted under 35 U.S.C. 154(b) by 77 days.

(21) Appl. No.: 16/489,522

(22) PCT Filed: Feb. 9, 2018

(86) PCT No.: PCT/JP2018/004734
§ 371 (c)(1),
(2) Date: Aug. 28, 2019

(87) PCT Pub. No.: WO2018/159272
PCT Pub. Date: Sep. 7, 2018

(65) Prior Publication Data
US 2020/0072771 A1    Mar. 5, 2020

(30) Foreign Application Priority Data
Feb. 28, 2017 (JP) .............................. JP2017-037139

(51) Int. Cl.
*G01N 23/227* (2018.01)
*G01N 23/2273* (2018.01)
*G02F 1/35* (2006.01)

(52) U.S. Cl.
CPC ....... *G01N 23/227* (2013.01); *G01N 23/2273* (2013.01); *G02F 1/353* (2013.01)

(58) Field of Classification Search
CPC ... G01N 23/227; G01N 23/2273; G02F 1/353
(Continued)

(56) References Cited

U.S. PATENT DOCUMENTS

2015/0330908 A1* 11/2015 Koldiaev ............. G01N 21/636
356/237.2
2020/0088784 A1*  3/2020 Lei ..................... G01N 21/9501
2020/0110029 A1*  4/2020 Lei ..................... G01N 21/8806

FOREIGN PATENT DOCUMENTS

JP    2002168814 A    6/2002
JP    2011029435 A    2/2011
JP    2016138801 A    8/2016

OTHER PUBLICATIONS

International Search Report issued in corresponding International Application No. PCT/JP2018/004734, dated May 15, 2018, with translation (6 pages).
(Continued)

*Primary Examiner* — Kiet T Nguyen
(74) *Attorney, Agent, or Firm* — Osha Bergman Watanabe & Burton LLP

(57) ABSTRACT

A time-resolved photoemission electron microscopy including: a laser light source that outputs a pulse having less than or equal to a femtosecond level pulse width and variable repetition frequency; a pump light pulse generator configured to generate pump light pulse that excites photo-carriers of a sample by converting wavelength of light output from the laser light source; and a probe light pulse generator
(Continued)

configured to generate probe light pulse that photo-emits photo-carriers excited by the pump light pulse from the sample by photoelectric effect by converting wavelength of light output from the laser light source. The energy of at least one of the pump light pulse and the probe light pulse is configured to continuously vary in a range not less than 0.1 eV and not more than 8 eV.

11 Claims, 13 Drawing Sheets

(58) Field of Classification Search
USPC .................................................. 250/306, 307
See application file for complete search history.

(56) References Cited

OTHER PUBLICATIONS

Written Opinion issued in corresponding International Application No. PCT/JP2018/004734, dated May 15, 2018, with translation (8 pages).
International Preliminary Report on Patentability issued in corresponding International Application No. PCT/JP2018/004734, dated Jul. 4, 2018, with translation (11 pages).
Fukumoto, Keiki, et al. "Femtosecond time-resolved photoemission electron microscopy for spatiotemporal imaging of photogenerated carrier dynamics in semiconductors." Review of Scientific Instruments, vol. 85, p. 083705-1-083705-6, 2014 (7 pages).
Kubo, Atsushi, et al. "Femtosecond Imaging of Surface Plasmon Dynamics in a Nanostructured Silver Film." Nanoletters, vol. 5, No. 6, p. 1123-1127, 2005 (5 pages).

* cited by examiner

BAND STRUCTURE OF GaAs

BAND STRUCTURE OF N-TYPE GaAs

UNIVERSAL CURVE

TIME-RESOLVED PHOTOEMISSION ELECTRON MICROSCOPY AND METHOD FOR IMAGING CARRIER DYNAMICS USING THE TECHNIQUE

FIELD

The present invention relates to a time-resolved photoemission electron microscopy combining a pump/probe method and photoemission electron microscopy, wherein a femtosecond pulse laser is used as a light source outputting a pulse whose pulse width is less than or equal to a femtosecond level and whose repetition frequency is variable. In more detail, the present invention relates to a time-resolved photoemission electron microscopy configured to observe the behavior of charge carriers (hereinafter, also referred to as carrier dynamics) in a target sample with high sensitivity, and an acquisition method of imaging carrier dynamics by this technique.

BACKGROUND

A method has already been proposed that observes the behavior of electrons in a metalic material in accordance with the pump/prove method by using a pulse laser whose repetition frequency and wavelength are fixed as an excitation light source of the photoemission electron microscopy (see Non-patent Literature 1). On the other hand, it is strongly desired to develop a device and method which may directly observe the behavior of electrons in a semiconductor material and an insulator having high resistivity, and not in a metalic material. A femtosecond pulse laser having a temporal width of a femtosecond level may be used in order to implement a high time-resolved resolution i.e., femtosecond scale. Since the sample is charged due to the shortage of electrons by irradiating with a femtosecond pulse laser, it is not easy to create an image of carrier dynamics by an observation device, such as an electron microscope and photoemission electron microscopy.

The influence of charging of a sample due to irradiation with a femtosecond pulse laser may be reduced by reducing the photon density of the pulse of the femtosecond pulse laser. However, when the photon density of the pulse of the femtosecond pulse laser is reduced, the measurement time may be longer and, the signal-noise ratio (SN ratio) may be reduced.

In order to solve the above-described problems, the inventors, et al. of the present invention have proposed a time-resolved photoemission electron microscopy combining the pump/probe method and the photoemission electron microscopy, using a repetition frequency variable femtosecond pulse laser as a light source (see Patent Literature 1). Since the photoemission electron microscopy described in Patent Literature 1 may suppress charging of a sample, the carrier dynamics in a semiconductor may be observed with a high temporal resolution and a high spatial resolution.

CITATION LIST

Patent Literature

[PTL 1] Japanese Unexamined Patent Publication No. 2016-138801

Non Patent Literature

[NPL 1] A. Kubo et. al., "Femtosecond imaging of surface plasmon dynamics in a nanostructured silver film", Nano-Letters, 5 (6), 1123, 2005

SUMMARY

Technical Problem

An object of the present invention is to provide a technique configured to acquire a photoelectron image having a high S/N ratio by further improving a time-resolved photoemission electron microscopy combining the pump/probe method and the photoemission electron microscopy and further reducing charging of a sample.

Solution to Problem

According to a first aspect of the present invention, in order to attain the above-described object, there is provided a time-resolved photoemission electron microscopy having a laser light source that outputs a pulse having less than or equal to a femtosecond level pulse width and variable repetition frequency, a pump light pulse generator configured to generate pump light pulse that excites the photocarriers in a sample by converting the wavelength of light pulse output from the laser light source, and a probe light pulse generator configured to generate probe light pulse that photo-emits the photo-excited carriers by the pump light from the sample by the photoelectric effect by converting the wavelength of the light output from the laser light source, and at least the energy of one of the pump light pulse and that of the probe light pulse can be varied continuously.

In the time-resolved photoemission electron microscopy described above, the probe light pulse generator may be configured to continuously vary the energy of the probe light pulse.

In the time-resolved photoemission electron microscopy described above, the probe light pulse generator may have an optical parametric amplifier that converts the wavelength of light output from the laser light source.

Further, the time-resolved photoemission electron microscopy described above may comprise one or more high-order harmonic generation device that generates the probe light pulse from the light source whose wavelength is converted by the optical parametric amplifier.

Further, in the time-resolved photoemission electron microscopy described above, the variable range of the energy in the probe light pulse generator may be within ±3 eV with respect to the electron affinity or the work function of the target sample.

Further, the time-resolved photoemission electron microscopy described above may further have a focusing lens stage that keeps constant the focusing position and size of the probe light pulse.

Further, in the time-resolved photoemission electron microscopy described above, the position of the focus lens maybe moved by drive stages.

Further, in the time-resolved photoemission electron microscopy described above, the laser light source may have a first laser light source that outputs light to the pump light pulse generator, a second laser light source that outputs light to the probe light pulse generator, and a timing control device that controls timing at which the first laser light source and the second laser light source output light.

Further, in the time-resolved photoemission electron microscopy described above, the pump light pulse generator may be configured to continuously vary the energy of the pump light pulse.

According to a second aspect of the present invention, there is provided a method of acquiring a image of photo-excited carrier dynamics by using a time-resolved photoemission electron microscopy that observes photo-carriers excited by the pump light pulse irradiation by irradiating the sample with the probe light pulse by the photoelectric effect, i.e., an acquisition method of a carrier dynamics image by making continuously variable the energy of the probe light in a range within ±3 eV with respect to the electron affinity or the work function of the sample, measuring a photoelectron emission intensity, finding the work function of the observation-target area of the sample from a variation over time in the photoelectron emission intensity, determining the value in accordance with the found work function as the energy of the probe light, and acquiring the carrier dynamics image by the determined probe light energy.

Advantageous Effects of Invention

A photoelectron image having a high S/N ratio may be acquired by further improving a time-resolved photoemission electron microscopy combining a pump/probe method and photoemission electron microscopy and further reducing charging of a sample.

More specifically, a local (nanoscale) work function of a sample, the energy of a band gap, presence/absence of an impurity level, and energy of the impurity level may be estimated (first effect), by the time-resolved photoemission electron microscopy and the method according to the present invention. Further, an image having a high S/N ratio by reducing the influence of charging of a sample may be acquired (second effect), by the time-resolved photoemission electron microscopy and the method according to the present invention. Furthermore, the escape depth of a carrier from a sample by selecting the kinetic energy of emitted photoelectrons may be controlled (third effect), by the time-resolved photoemission electron microscopy and the method according to the present invention. Still furthermore, sample bulk information may be acquired (by the third effect).

BRIEF DESCRIPTION OF DRAWINGS

FIG. 2A is a first diagram for explanation and FIG. 2B is a second diagram for explanation;

DESCRIPTION OF EMBODIMENTS

Figure 1:
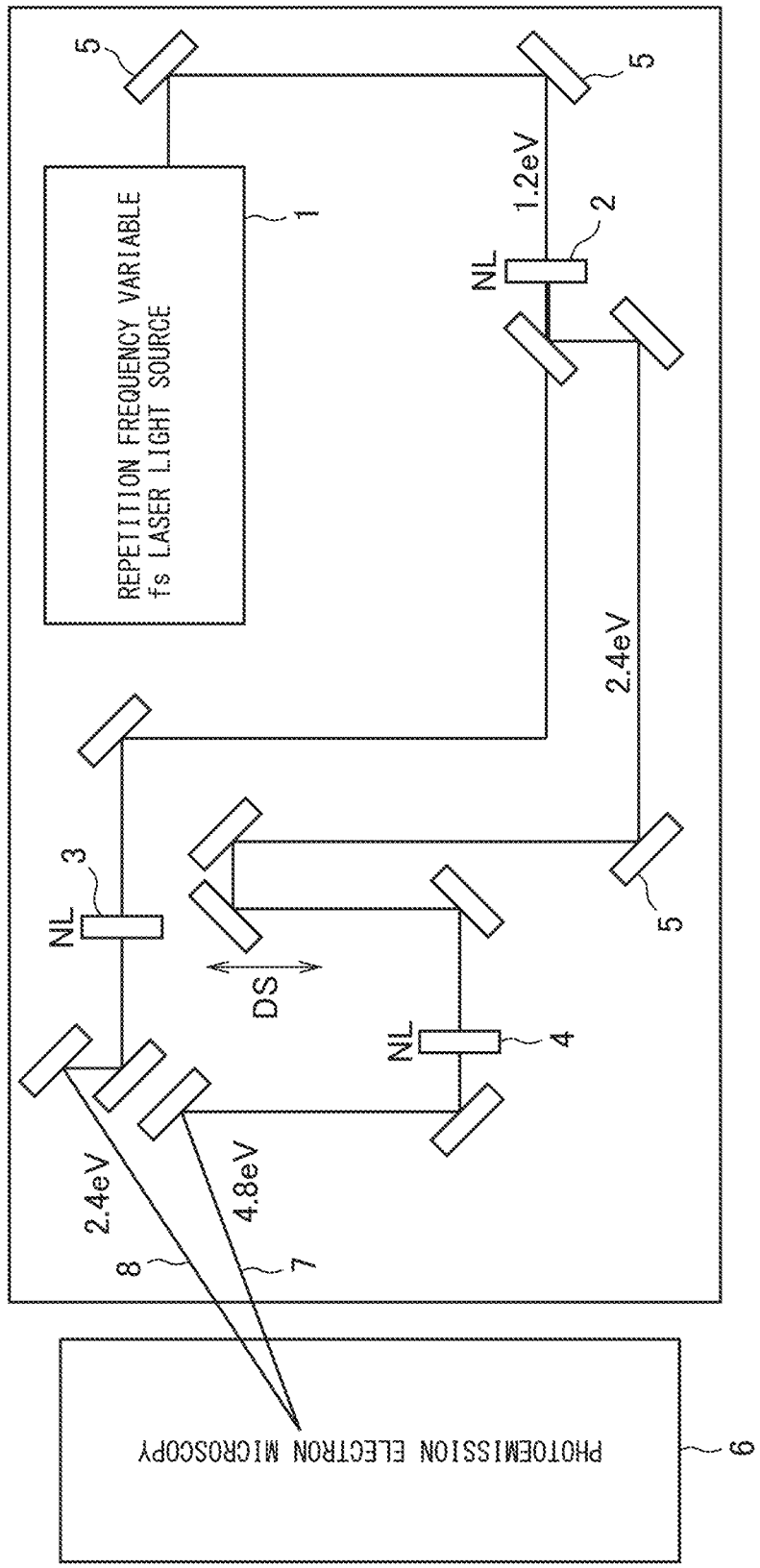
FIG. 1 is a diagram showing an outline configuration of a conventional time-resolved photoemission electron microscopy using a repetition frequency variable femtosecond pulse laser.

FIG. 1 is a diagram showing an outline configuration of the time-resolved photoemission electron microscopy proposed by the inventors, et al. of the present invention in Patent Literature 1. Although the details and the operation principles of the time-resolved photoemission electron microscopy shown in FIG. 1 are described in Patent Literature 1, an outline of the time-resolved photoemission electron microscopy shown in FIG. 1 is described briefly below in order to understand easily the present invention.

In a time-resolved photoemission electron microscopy 100, symbol 1 indicates a repetition frequency variable femtosecond pulse laser light source whose oscillation wavelength, pulse width, and repetition frequency are 1,028 nm (1.2 eV), 180 fs, and 1 kHz to 1 MHz, respectively. Symbols 2, 3, and 4 indicate a first, a second, and a third nonlinear optical crystals (NL), respectively, for converting the wavelength of pulse laser light generated by the pulse laser light source 1. A plurality of symbols 5 each indicates an optical mirror for converting a light path and focusing light. Symbol 6 indicates photoemission electron microscopy and symbol DS indicates an optical delay stage for delaying probe light 8 that enters the photoemission electron microscopy 6.

In the time-resolved photoemission electron microscopy 100, the laser light generated by the femtosecond pulse laser light source 1 and having a wavelength corresponding to 1.2 eV may be converted into the pump light (excitation light) 8 having a wavelength corresponding to 1.2 eV or 2.4 eV by appropriately selecting and driving the first and second nonlinear optical crystals 2 and 3. Further, the laser light having a wavelength corresponding to 1.2 eV may be converted into a probe light pulse (detection light pulse) 7 having a wavelength corresponding to 4.8 eV, by the first and third nonlinear optical crystals 2 and 4. The optical delay stage DS may be inserted into the generation path of probe light 7 or may be inserted into the generation path of the pump light 8.

In the time-resolved photoemission electron microscopy shown in FIG. 1, a repetition frequency f of the femtosecond pulse laser light output from the femtosecond pulse laser light source 1 is set so that f<1/τ holds, wherein the forbidden bandwidth of a sample set within the photoemission electron microscopy 6 is taken as Eg, the work function as φ, and the life of the photo-excited carriers (electron) as τ. Further, energy Ea of the pump light 8 whose wavelength is λa is set so that Ea>Eg holds for the forbidden bandwidth Eg of the sample. Furthermore, energy Eb of the probe light pulse 7 whose wavelength is λb is set so that Eb>φ holds for the work function φ of the sample. The sample is prevented from charging due to irradiation of the femtosecond pulse laser light, by setting the repetition frequency f of the femtosecond pulse laser light, the energy Ea of the pump light 8, and the energy Eb of the probe light pulse 7 as described above. Since the time-resolved photoemission electron microscopy 100 can suppress the charging of a sample due to irradiation of the femtosecond pulse laser light, the carrier dynamics may be observed by photoemission electron microscopy.

Figure 2A:
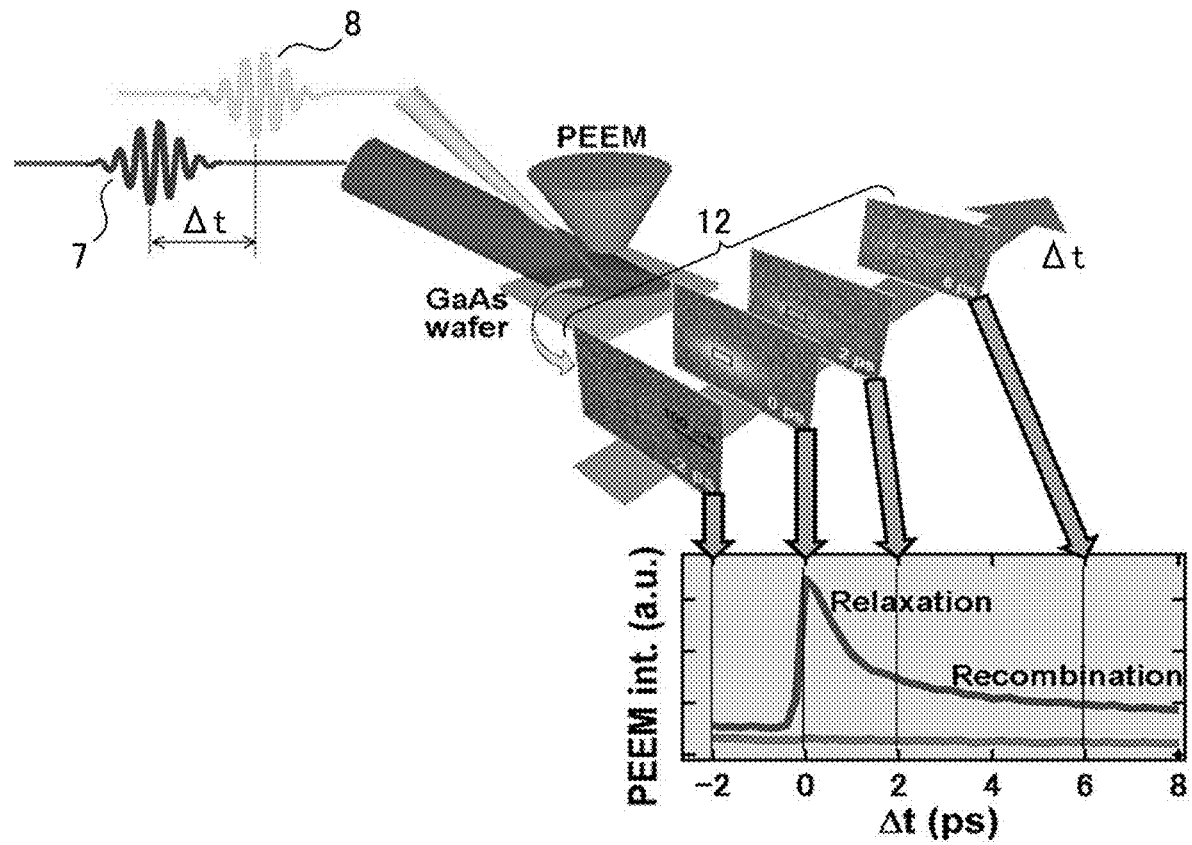
FIG. 2A and FIG. 2B are diagrams conceptually showing time/space/-resolved measurement by the time-resolved photoemission electron microscopy shown in FIG. 1
Figure 2B:
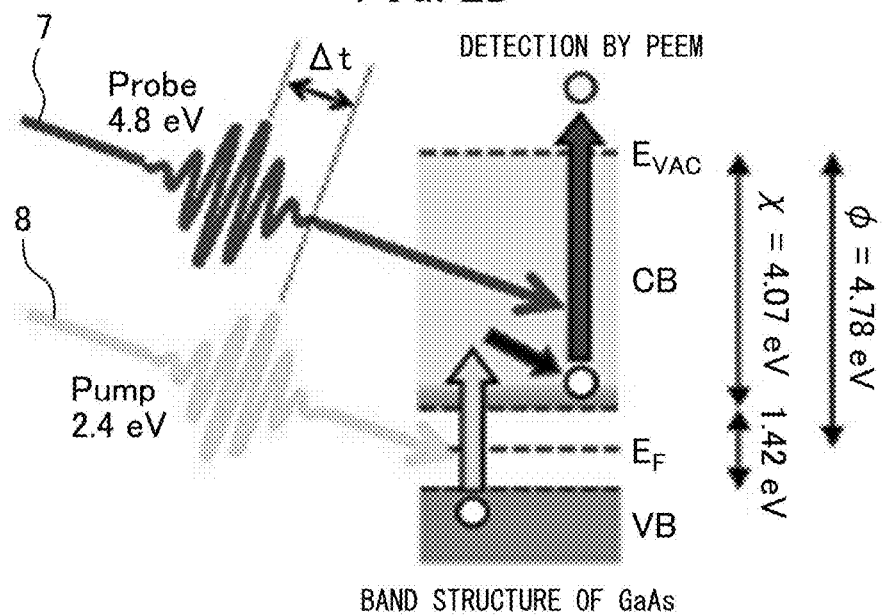

FIG. 2A and FIG. 2B are diagrams conceptually showing a time/space-resolved measurement method of a photo-excited electron using the time-resolved photoemission electron microscopy 100, FIG. 2A is a first diagram for explanation and FIG. 2B is a second diagram for separation. In FIG. 2B, a band structure of GaAs is shown and VB indicates a valence band, $E_F$ indicates a Fermi level, CB indicates a conduction band, and $E_{VAC}$ indicates a vacuum level.

When a sample, such as a GaAs wafer (see FIG. 2A), is irradiated with, for example, the pump light pulse 8 of 2.4 eV, an electron located in the valence band is excited to the conduction band. Next, the electrons excited to the conduction band by the irradiation of the pump light pulse 8 is emitted from the sample as photoelectrons, by irradiating the sample with the probe light pulse 7. The photoelectrons emitted from the sample as photoelectrons are observed by the photoemission electron microscopy.

In FIG. 2B, the work function φ corresponds to the energy difference between the Fermi level $E_F$ and the vacuum level $E_{VAC}$. An electron affinity χ corresponds to the energy difference between the vacuum level $E_{VAC}$ and the conduction band. The electron affinity χ is ionization energy.

In FIG. 2A, symbols 12 indicates images observed at a time interval of 2 ps by the photoemission electron microscopy 6, and a small rectangle on each image corresponds to the irradiation area of the pump light 8 on the GaAs wafer. The graph at the bottom right in FIG. 2A is a graph representing a variation over time in the PEEM intensity (PEEM Int.) found from the observation by the photoemission electron microscopy 6. The vertical axis in the graph at the bottom left in FIG. 2A represents the PEEM intensity in arbitrary units and the horizontal axis represents a measurement time Δt in ps.

The photoemission electron microscopy 6 may observe the carrier dynamics, when Δt=0 the intensity of the photo-electron emission shows the peak and the PEEM intensity decreases gradually by energy relaxation and recombination of the carriers, diffusion into the inside of the sample, and the like. On the other hand, when the influence of charging of the sample is large, the photoemission electron microscopy 6 does not create images of the carrier dynamics, since the decrease in the PEEM intensity does not occur as shown in the graph at the bottom right in FIG. 2A.

Although the inventors, et al. of the present invention have repeatedly performed the experiment to capture images showing the carrier dynamics in insulator and semiconductor materials by using the time-resolved photoemission electron microscopy 100, the influence of charging of the sample is large, and therefore it is not easy to stably capture images with a high S/N ratio. The inventors, et al. of the present invention have found a time-resolved photoemission electron microscopy configured to continuously vary the energy of the pump light pulse and the probe light pulse, i.e., the wavelength of the pump light pulse and the probe light pulse. The inventors, et al. of the present invention have performed various experiments by using the time-resolved photoemission electron microscopy configured to continuously vary the energy of the pump light pulse and the probe light pulse, and found that unexpected effects as summarized in the following are obtained.

(1) Observation of work function, band gap energy, presence/absence of an impurity level, and impurity level energy of a sample can be estimated in a small area, such as a nanoscale area. Conventionally it was not possible.

(2) The S/N ratio of a captured image may be significantly improved by reducing charging of a sample due to irradiation of a femtosecond pulse laser.

(3) Bulk information on a material by sample depth direction-resolved measurement may be obtained by controlling the kinetic energy of emitted photoelectrons.

In the following, the time-resolved photoemission electron microscopy configured to continuously vary the energy of at least one of the pump light pulse and the probe light pulse is explained in detail.

Figure 3:
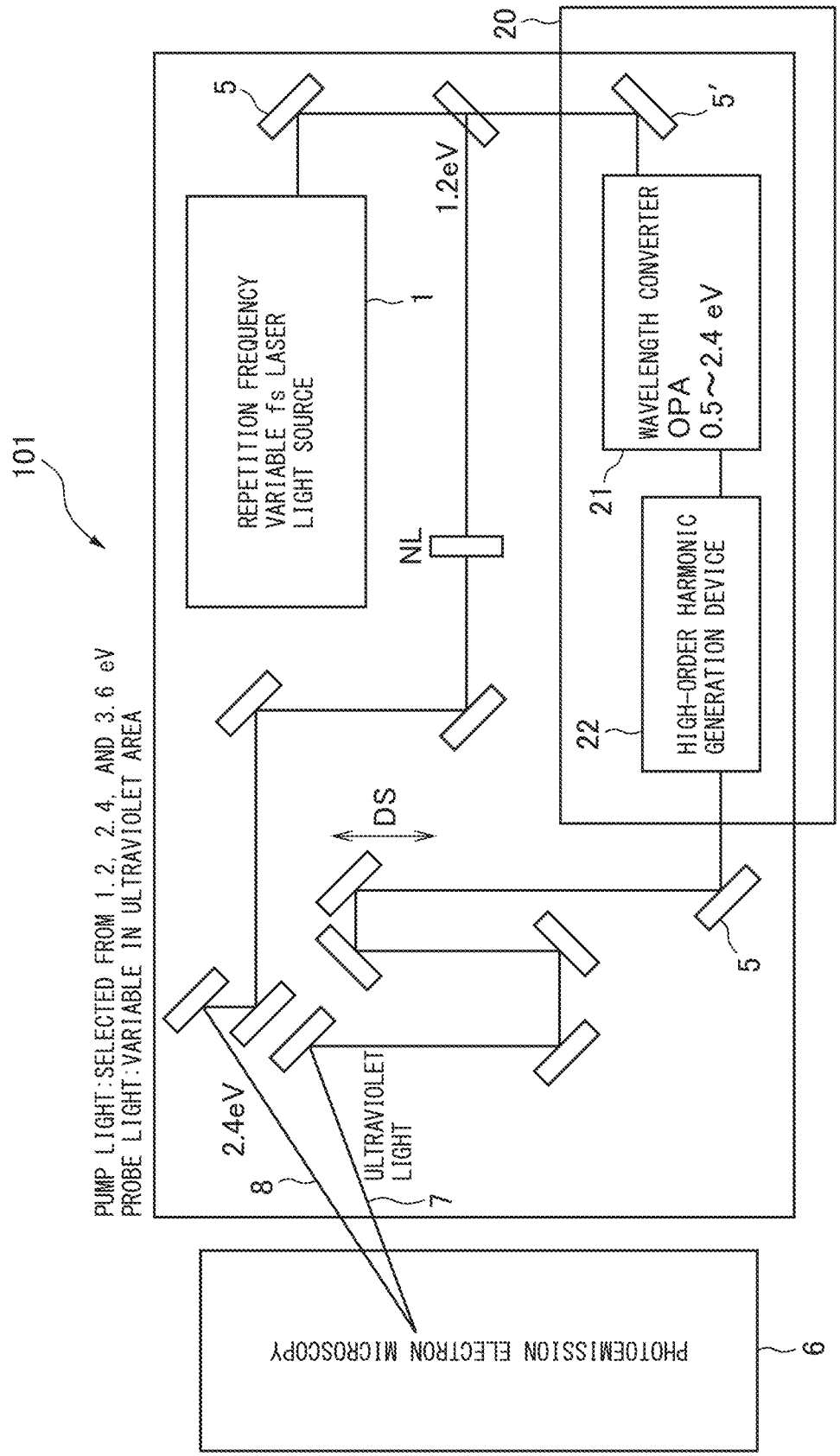
FIG. 3 is a diagram showing an outline configuration of a time-resolved photoemission electron microscope device according to a first embodiment.

FIG. 3 is a block diagram showing an outline configuration of a time-resolved photoemission electron microscopy according to a first embodiment. In FIG. 3, since the components denoted by the same symbols as those in FIG. 1 indicate the same or similar components of the device in FIG. 1, duplicated explanation is not given.

A time-resolved photoemission electron microscopy 101 has the laser light source 1, a pump light generator, a probe light generator, and the photoemission electron microscopy 6. The laser light source 1 outputs a pulse having femtosecond level pulse width and variable repetition frequency. The pump light generator includes optical elements, such as a nonlinear optical crystal (NL) and lenses, and generates pump light pulse that excites photo-carriers of a sample by converting the wavelength of the light output from the laser light source. The probe light generator includes a probe light energy variable device 20 and converts the wavelength of the light output from the laser light source, and generates the probe light pulse that photo-emits photo-carriers excited by the pump light pulse from the sample by the photoelectric effect.

In the time-resolved photoemission electron microscopy 101, symbol 20 indicates the probe light energy variable device having a function for varying the energy and wavelength of the probe light pulse 7. The probe light energy variable device 20 has an optical mirror 5', a wavelength converter 21, and a high-order harmonic generation device 22 and the optical mirror 5' may be arranged outside the probe light energy variable device 20.

The wavelength converter 21 is an optical parametric amplifier (OPA) configured to vary, for example, the photon energy of the output light in a range between 0.5 eV and 2.0 eV or a range between 0.5 eV and 2.4 eV. The energy generated by the wavelength converter 21 depends on the laser light source 1. It is preferable that the probe light energy variable device 20 may continuously vary the energy in a range of ±3 eV with respect to the ionization energy, the work function, or the electron affinity of the target sample. The baseline and the saturation of intensity in the photoelectron emission intensity become clear, since the probe light energy variable device 20 varies the energy continuously in a range of ±3 eV with respect to the ionization energy, the work function, or the electron affinity of the observation-target sample. Since the baseline and the saturation of intensity in the photoelectron emission intensity become clear, the time-resolved photoemission electron microscope device 101 may observe and measure the energy in a wide energy range.

Further, in the time-resolved photoemission electron microscopy 101, the excitation light, i.e., the pump light 8 may be selected at three levels of 1.2 eV, 2.4 eV, and 3.6 eV by appropriately select and drive the nonlinear optical crystal (NL) arranged in the pump light generator, in order to widen the range of the target sample. In the time-resolved photoemission electron microscopy 101, although the pump light 8 may be selected at the three levels of 1.2 eV, 2.4 eV, and 3.6 eV, in the time-resolved photoemission electron microscopy according to the embodiment, the pump light may be selected discretely at a plurality of arbitrary energies.

It is preferable that the probe light energy variable device 20 controls the energy of the probe light in a range not less than 3 eV and not more than 5 eV, and it is further preferable that the probe light energy variable device 20 controls the energy of the probe light in a range not less than 0.1 eV and not more than 8 eV. It is preferable that the probe light energy variable device 20 controls the energy of the probe light at an interval of 0.5 eV or less, and it is further preferable that the probe light energy variable device 20 controls the energy of the probe light at an interval of 0.1 eV or less. Further, it is still further preferable that the probe light energy variable device 20 controls the energy of the probe light at an interval of 0.01 eV or less.

Figure 4:
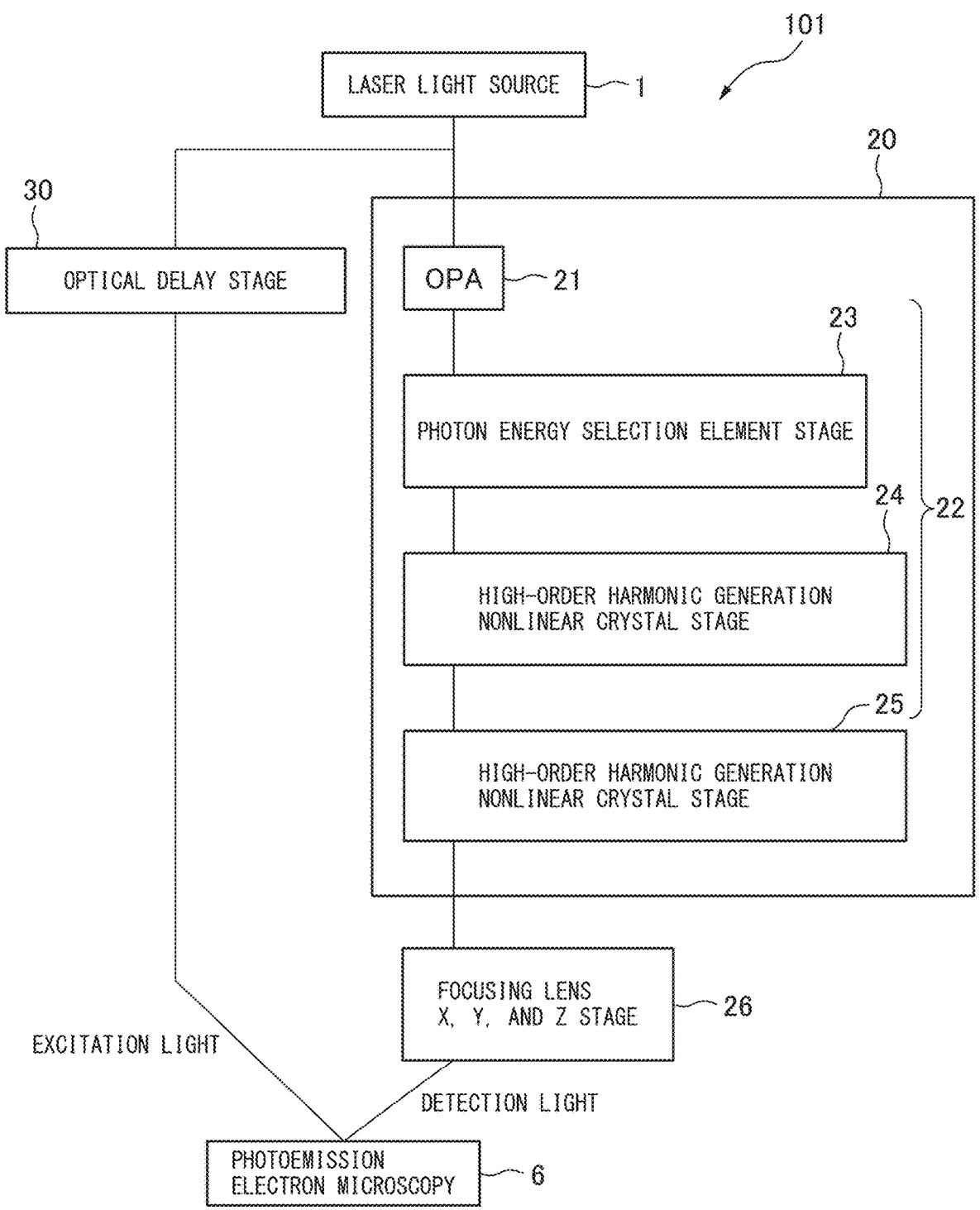
FIG. 4 is a block diagram showing a detailed configuration of the time-resolved photoemission electron microscope device shown in FIG. 3.

FIG. 4 is a block diagram showing a detailed configuration of the time-resolved photoemission electron microscopy 101. In the time-resolved photoemission electron microscopy 101, the probe light energy variable device 20 has the wavelength converter 21, which is an OPA, a photon energy selection element stage 23, a first high-order harmonic generation nonlinear crystal stage 24, and a second high-order harmonic generation nonlinear crystal stage 25. The photon energy selection element stage 23, the first high-order harmonic generation nonlinear crystal stage 24, and the second high-order harmonic generation nonlinear crystal stage 25 correspond to the high-order harmonic generation device 22. Symbol 26 indicates a focus lens stage including a plurality of focus lenses configured to moving in the directions of three axes (X-axis, Y-axis, Z-axis) for accurately focusing the probe light energy-modulated through each of the stages 23, 24, and 24 to the sample position of the photoemission electron microscopy 6.

The photon energy selection element stage 23 selects a pair of mirrors and a polarizer for selecting energy and polarized light, in accordance with the photon energy generated from the OPA 21. The position of the pair of mirrors and a polarizer for selecting energy and polarized light is adjusted by a drive element, such as a motor and a piezo element in the photon energy selection element stage 23.

The first high-order harmonic generation nonlinear crystal stage 24 adjusts the rotation angle and the position in the vertical and horizontal directions with respect to the optical axis of the nonlinear crystal for generating a high-order harmonic. The nonlinear crystal is an element that doubles the energy of a pulse. The rotation and position of the nonlinear crystal is adjusted by a drive element, such as a motor and a piezo element for efficiently generating a high-order harmonic (second-order harmonic).

The second high-order harmonic generation nonlinear crystal stage 25 adjusts the rotation angle and the position in the vertical and horizontal directions with respect to the optical axis of the nonlinear crystal for generating a high-order harmonic. The nonlinear crystal is an element that doubles the energy of a pulse. The rotation and position of the nonlinear crystal is adjusted by a drive element, such as a motor and a piezo element for efficiently generating a high-order harmonic (second-order harmonic). The linear crystal of the second high-order harmonic generation nonlinear crystal stage 25 differs from the linear crystal of the first high-order harmonic generation nonlinear crystal stage 24 in the crystal orientation of cutout.

For example, when a pulse of 6 eV is generated in the high-order harmonic generation device 22, a pulse is generated by using both the first high-order harmonic generation nonlinear crystal stage 24 and the second high-order harmonic generation nonlinear crystal stage 25. Specifically, a pulse of 1.5 eV input from the wavelength converter 21 is converted into 3 eV in the first high-order harmonic generation nonlinear crystal stage 24 and converted into 6 eV in the second high-order harmonic generation nonlinear crystal stage 25. Further, when a pulse of 4 eV is generated in the high-order harmonic generation device 22, a pulse is generated by using only the first high-order harmonic generation nonlinear crystal stage 24. Specifically, a pulse of 2 eV input from the wavelength converter 21 is converted into 4 eV in the first high-order harmonic generation nonlinear crystal stage 24.

Further, the 3-axis focus lens stage 26 moves the focus lens in the X-axis direction, the Y-axis direction, and the Z-axis direction in order to keep constant the focusing size and position of the pump light on the surface of the sample i.e., the observation target, wherein the focusing size and position vary by a variation in the energy of the probe light. The focus lens is moved by a drive element, such as a motor and a piezo element, by the automatically controlled by a focus lens control device, not shown schematically.

An optical delay stage 30 corrects a deviation in time between the pump light 8 and the probe light 7. A deviation in time between the pump light pulse 8 and the probe light pulse 7 is corrected by a drive element, such as a motor and a piezo element, and the optical delay stage 30 corresponds to the optical delay stage DS shown in FIG. 3. Although the optical delay stage 30 is inserted into the path in which the probe light pulse is generated, the optical delay stage 30 may be arranged in one of the path in which the pump light is generated and the path in which the probe light is generated.

Figure 5:
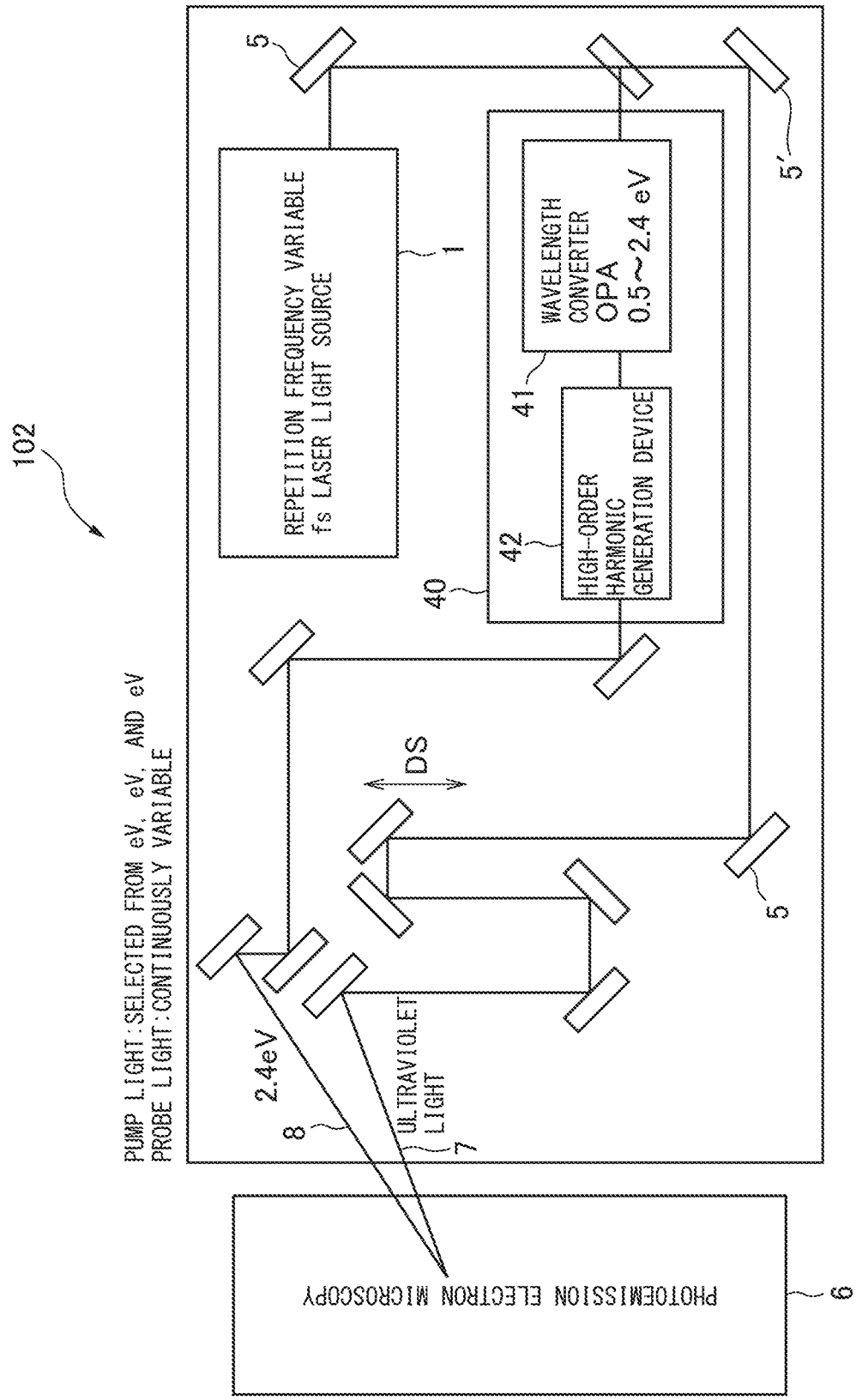
FIG. 5 is a diagram showing an outline configuration of a time-resolved photoemission electron microscopy according to a second embodiment.

FIG. 5 is a block diagram showing an outline configuration of a time-resolved photoemission electron microscopy according to a second embodiment. In FIG. 5, since the components denoted by the same symbols as those in FIG. 1 indicate the same or similar components as those of the device in FIG. 1, duplicated explanation is not given.

In a time-resolved photoemission electron microscopy 102, symbol 40 indicates a pump light energy variable device having a function for varying the energy and wavelength of the pump light 8. The pump light energy variable device 40 has a wavelength converter 41 and a high-order harmonic generation device 42.

The wavelength converter 41 is the optical parametric amplifier (OPA) configured to vary the photon energy of the output light in a range between 0.5 eV and 2.4 eV, like the wavelength converter 21. It is preferable that the pump light energy variable device 40 may continuously vary the energy in a range of ±3 eV with respect to the energy of the band gap of the observation-target sample. The energy of the band gap, the presence/absence of the impurity level, also referred to as the defect level, and the energy of the impurity level become clear, since the pump light energy variable device 40 varies the energy in a range of ±3 eV with respect to the energy of the band gap of the target sample. Since the energy of the band gap, the presence/absence of the impurity level, and the energy of the impurity level become clear, the time-resolved photoemission electron microscopy 102 may measure the variation of the band gap in a small area of the sample and the distribution of the impurity level.

Further, in the time-resolved photoemission electron microscope device 102, the probe light 7 may be selected at five levels of 1.2 eV, 2.4 eV, 3.6 eV, 4.8 eV, and 6 eV by appropriately select and drive the nonlinear optical crystal (NL) arranged in the probe light generator, in order to widen the range of the target sample. In the time-resolved photoemission electron microscopy 102, although the probe light 7 may be selected at the five levels of 1.2 eV, 2.4 eV, 3.6 eV, 4.8 eV, and 6 eV, in the time-resolved photoemission electron microscopy according to the present embodiment, the pump light may be selected discretely at a plurality of arbitrary energies.

The pump light energy variable device 40 may continuously vary the energy of the pump light from 0.1 eV up to about 8 eV. The band gap of many semiconductors is less than or equal to 5 eV, and even if the band gap is lower, the band gap is about 3 eV. Thus, the pump light energy variable device 40 may be applied to almost all the target. It is preferable that the pump light energy variable device 40 controls the energy of the probe light in a range not less than 3 eV and not more than 5 eV and it is further preferable that the pump light energy variable device 40 controls the energy of the probe light in a range not less than 0.1 eV and not more than 8 eV. It is preferable that the pump light energy variable device 40 controls the energy of the pump light at an interval of 0.5 eV or less, and it is further preferable that that the pump light energy variable device 40 controls the energy of the pump light at an interval of 0.1 eV or less. Further, it is preferable that the pump light energy variable device 40 controls the energy of the pump light at an interval of 0.01 eV or less.

Since the high-order harmonic generation device 42 has the same configuration as that of the high-order harmonic generation device 22, detailed explanation is omitted here.

Figure 6:
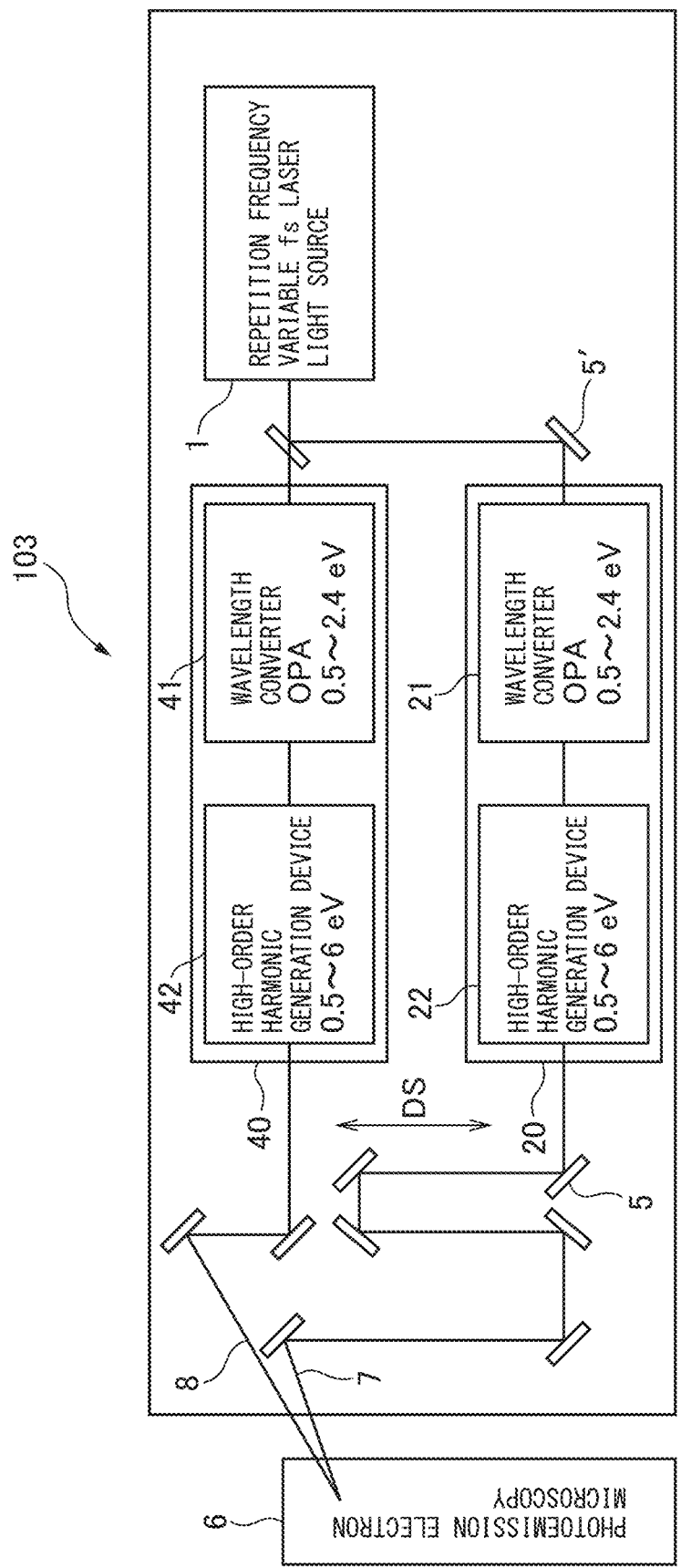
FIG. 6 is a diagram showing an outline configuration of a time-resolved photoemission electron microscopy according to a third embodiment.

FIG. 6 is a block diagram showing an outline configuration of a time-resolved photoemission electron microscopy according to a third embodiment. In FIG. 6, the components denoted by the same symbols as those in FIG. 1 indicate the same or similar components of the device in FIG. 1, and therefore duplicated explanation is not given.

A time-resolved photoemission electron microscopy 103 has the probe light energy variable device 20 and the pump light energy variable device 40, and both the energies of the probe light 8 and the pump light 7 can be varied continuously. Since the configurations and functions of the probe light energy variable device 20 and the pump light energy variable device 40 are already explained, detailed explanation is omitted here.

Since the time-resolved photoemission electron microscopy 103 may continuously vary the energy of the probe light pulse 8, the baseline and the saturation of intensity in the photoelectron emission intensity may become clear.

Further, since the time-resolved photoemission electron microscopy 103 may continuously vary the energy of the pump light pulse 7, the energy of the band gap, the presence/absence of the impurity level, and the energy of the impurity level may become clear.

Figure 7:
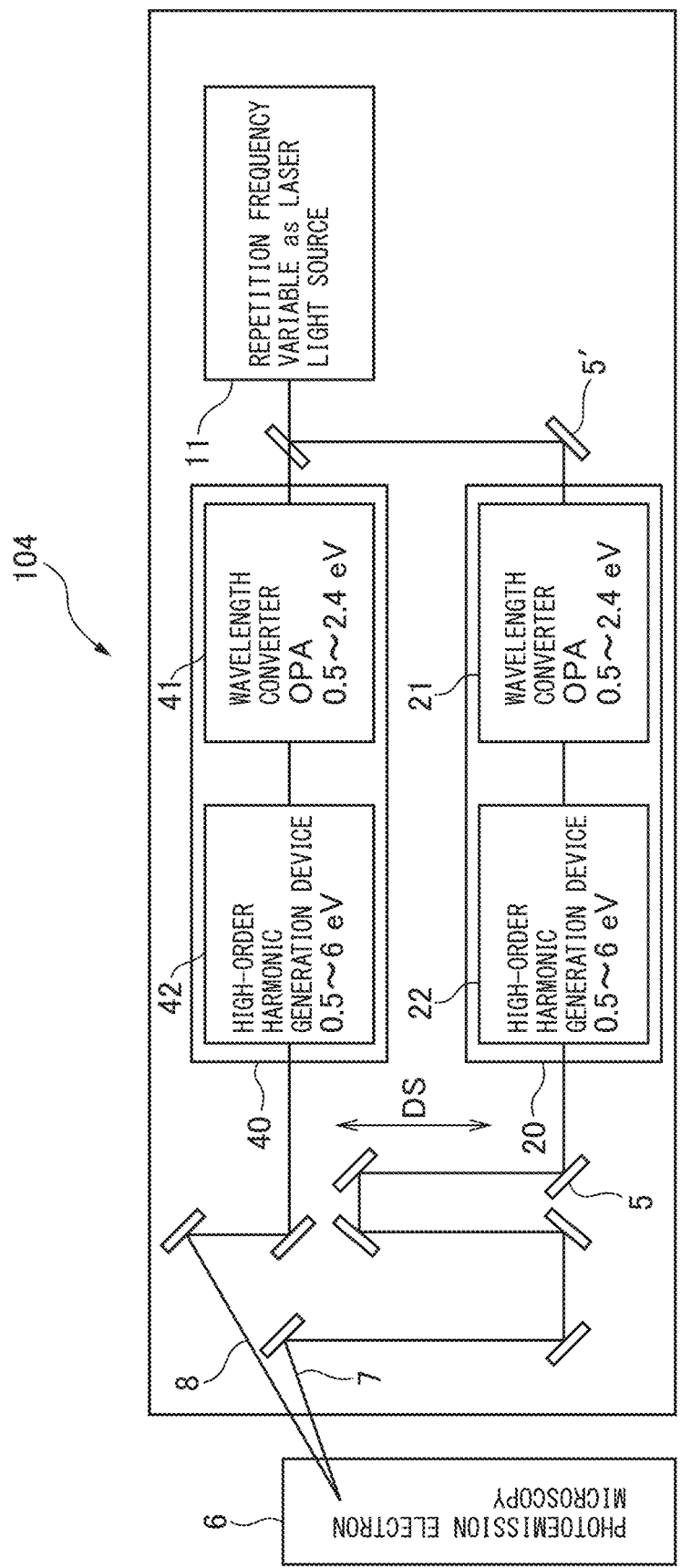
FIG. 7 is a diagram showing an outline configuration of a time-resolved photoemission electron microscopy according to a fourth embodiment.

FIG. 7 is a block diagram showing an outline configuration of a time-resolved photoemission electron microscopy according to a fourth embodiment. In FIG. 7, the components denoted by the same symbols as those in FIG. 6 indicate the same or similar components of the device in FIG. 6, and therefore duplicated explanation is not given.

A time-resolved photoemission electron microscopy 104 differs from the time-resolved photoemission electron microscopy 103 in having an attosecond pulse laser light source 11 in place of the femtosecond pulse laser light source 1. The attosecond pulse laser light source 11 is an attosecond pulse laser light source that outputs a pulse whose pulse width is the attosecond level and whose repetition frequency is variable. Since the attosecond pulse laser light source 11 has the same configuration and function as those of the femtosecond pulse laser light source 1 except in that the pulse width is the attosecond level, detailed explanation is omitted here.

Since the time-resolved photoemission electron microscopy 103 has the attosecond pulse laser light source 11 in place of the femtosecond pulse laser light source 1, the wavelength may be easily variable.

Figure 8:
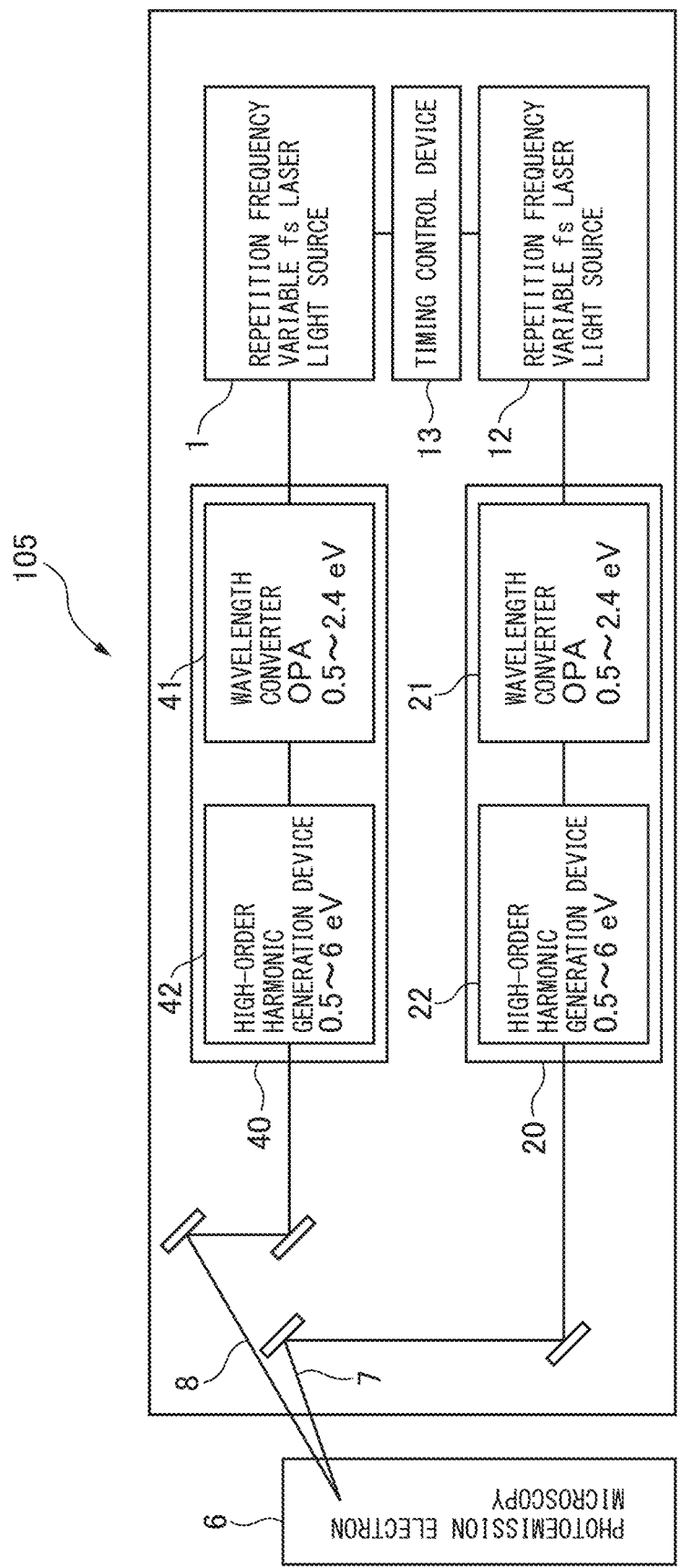
FIG. 8 is a diagram showing an outline configuration of a time-resolved photoemission electron microscopy according to a fifth embodiment.

FIG. 8 is a block diagram showing an outline configuration of a time-resolved photoemission electron microscopy according to a fifth embodiment. In FIG. 8, since the components denoted by the same symbols as those in FIG. 6 indicate the same or similar components of the device in FIG. 6, duplicated explanation is not given.

A time-resolved photoemission electron microscopy 105 differs from the time-resolved photoemission electron microscopy 103 in having a femtosecond pulse laser light source 12 and a timing control device 13. Further, the time-resolved photoemission electron microscopy 105 differs from the time-resolved photoemission electron microscopy 103 in not having the optical delay stage DS.

The femtosecond pulse laser light source 12 has a configuration similar to that of the femtosecond pulse laser light source 1. The femtosecond pulse laser light source 1 outputs femtosecond pulse laser light to the pump light energy variable device 40 and the femtosecond pulse laser light source 12 outputs femtosecond pulse laser light to the probe light energy variable device 20.

The timing control device 13 is, for example, an electronic computer and controls the timing at which each of the femtosecond pulse laser light source 1 and the femtosecond pulse laser light source 12 outputs femtosecond pulse laser light. The timing control device 13 controls each of the femtosecond pulse laser light source 1 and the femtosecond pulse laser light source 12 so as to output femtosecond pulse laser light at timing determined in accordance with the life of the carrier photo-excited by the pump light 8.

Since the time-resolved photoemission electron microscopy 105 generates the pump light 8 and the prove light 7, respectively, from laser light output from the separate femtosecond pulse laser light sources, the timing of irradiating a sample with the pump light 8 and the probe light 7 may be controlled with a higher accuracy.

First Example: Work Function Measurement

Figure 9:
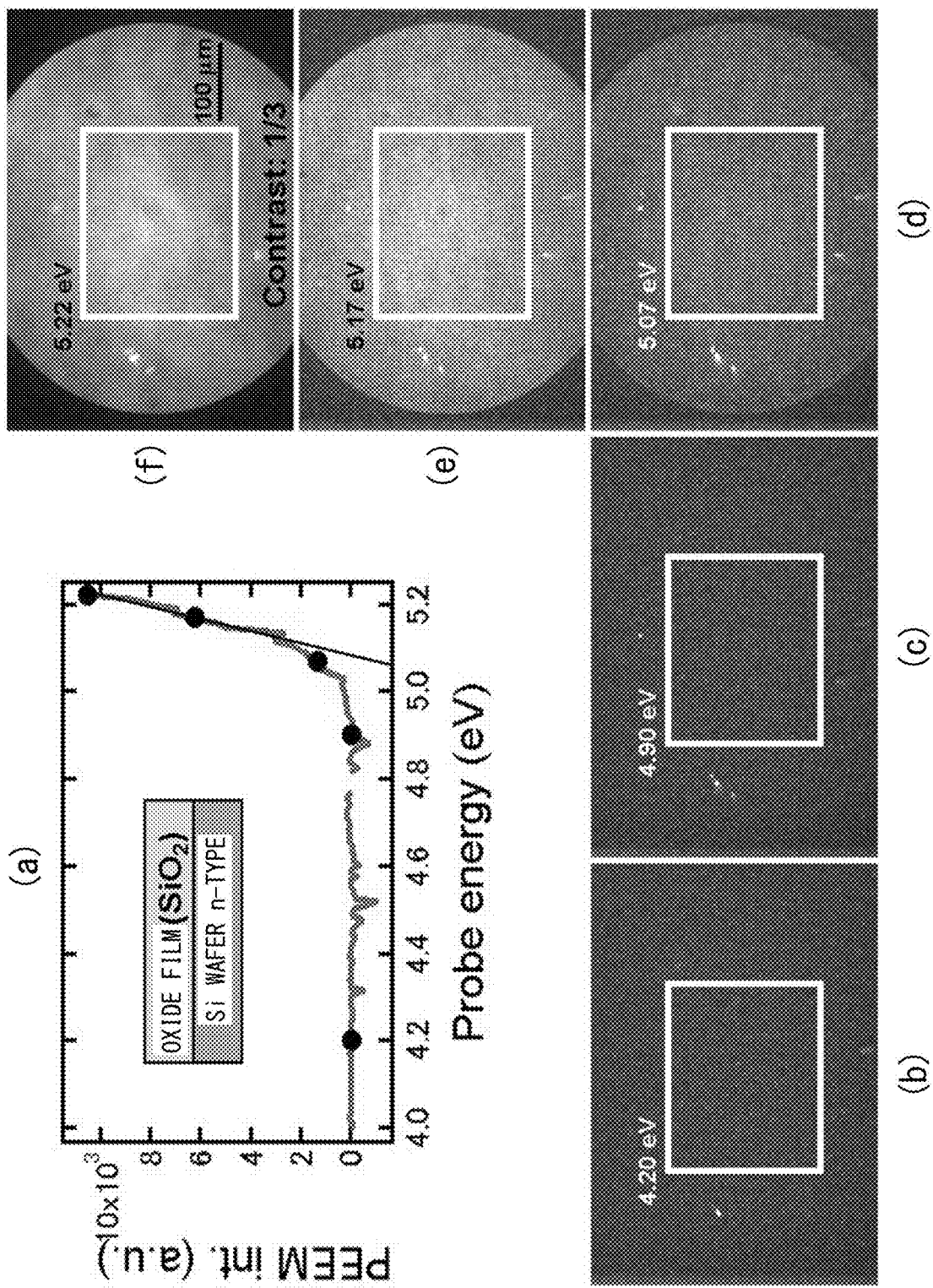
FIG. 9A to FIG. 9F are diagrams showing a relationship between the energy of probe light pulse and photoelectron emission intensity obtained by applying the time-resolved photoemission electron microscopy to an n-type Si wafer with an oxide layer shown in FIG. 3.

Unexpected effects as described above in the photoelectron emission observation of a sample may be obtained by developing the time-resolved photoemission electron microscopy according to the embodiment. FIG. 9 is a diagram showing a method of estimating the work function of a minute area of a sample by the time-resolved photoemission electron microscopy 101. In the first embodiment, an n-type Si wafer formed by a natural oxide film ($SiO_2$) is used as a sample, and while the energy of the probe light at a step of 40 meV is increased, the pump/probe method is performed and the PEEM image at each step is acquired.

FIG. 9A is a graph representing how the photoelectron emission intensity (PEEM int.) varies by a variation in the energy of the probe light, and FIG. 9B to FIG. 9F each show the PEEM image when the energy of the probe light is 4.20 eV, 4.90 eV, 5.07 eV, 5.17 eV, and 5.22 eV. The graph shown in FIG. 9A is a spectrum obtained by plotting the local intensity (for example, the portion enclosed by a rectangle in FIG. 9B to FIG. 9F) of the obtained photoemission electron microscopic images for the energy of the probe light.

The vertical axis in FIG. 9A represents the photoelectron emission intensity (PEEM Int.) in arbitrary units and the horizontal axis represents the energy of the probe light (Probe energy) in eV. The energy of the pump light is fixed to 2.4 eV. This experiment differs from the measurement method shown in FIG. 2 in that a temporal variation in the photoelectron emission intensity is not detected, i.e., the time-resolved measurement is not performed.

As shown in FIG. 9A, the photoelectron emission intensity (PEEM intensity) from the natural oxide film-attached n-type Si wafer rises suddenly from a point at which the energy of the probe light exceeds about 5 eV. The work function in the measurement area of the sample may be estimated from the slope in FIG. 9A. The work function estimated from the slope in FIG. 9A is 5.1 eV. As shown the images of the PEEM images in FIG. 9B to FIG. 9F, the energy of the probe light is vivid in the vicinity of the work function.

In general, the work function of Si is 5 eV (literature value) as a value when a material is seen macroscopically. However, according to the device of the present invention, the work function is different for each position on the sample surface, and the work function may be estimated with the spatial resolution of the photoemission electron microscopy.

Second Embodiment: Time/Space/Energy-Resolved Measurement

Figure 10:
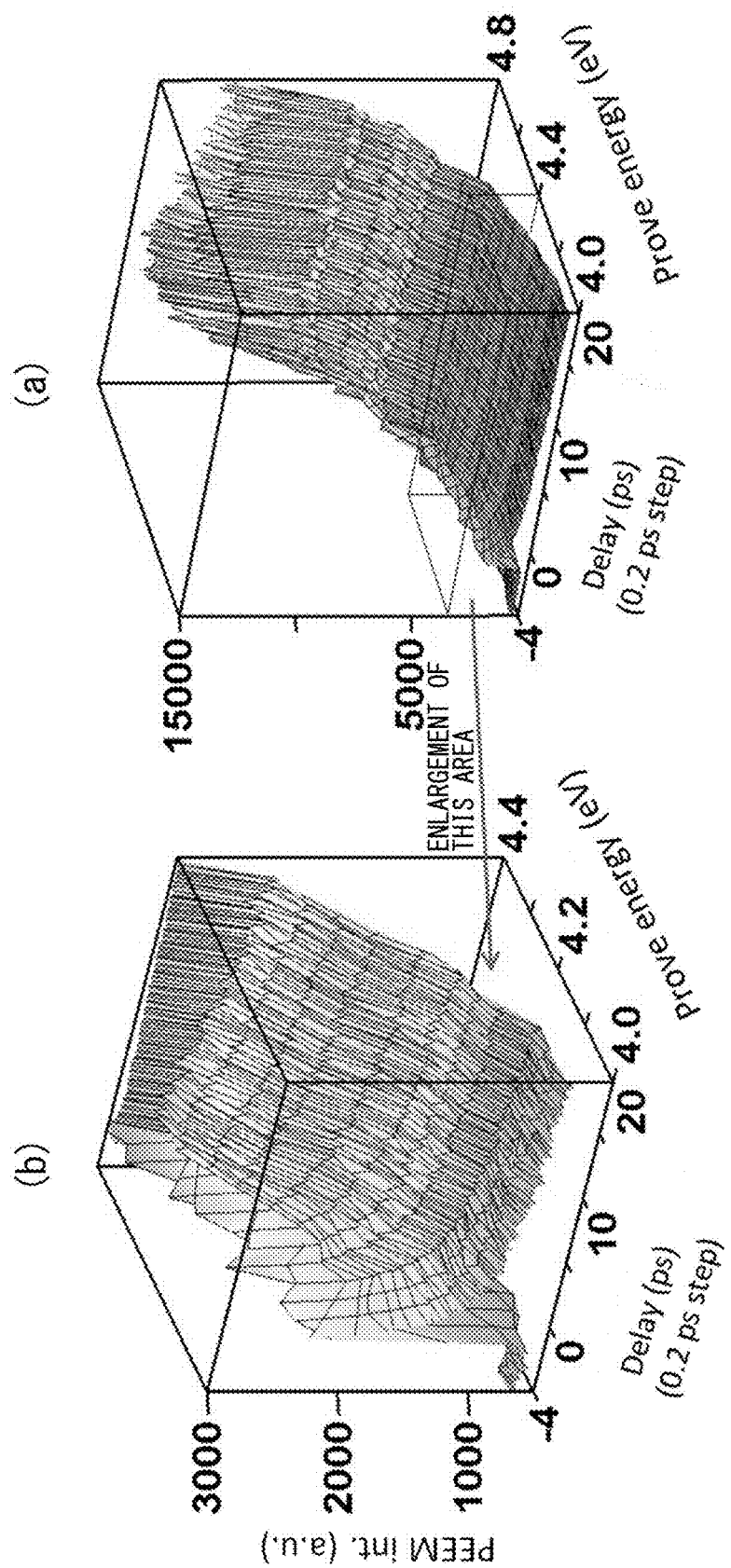
FIG. 10A and FIG. 10B are diagrams showing a relationship between the energy of probe light pulse, delay time, and photoelectron emission intensity obtained by applying the time-resolved photoemission electron microscopy to an n-type GaAs wafer shown in FIG. 3.

FIG. 10A and FIG. 10B are each a diagram showing a variation in local photoelectron emission intensity of a sample measured by using an n-type GaAs wafer as a sample and varying the energy of the probe light and the measurement time (delay time, Delay). The energy of the pump light is fixed to 2.4 eV and the exposure time is 1 s. The delay time is varied at a step of 0.2 ps and the energy of the probe light (Probe Energy) is varied at a step of 40 meV when the photoelectron emission intensity is measured. FIG. 10B is a partially enlarged diagram of FIG. 10A.

When the energy of the probe light exceeds 4.4 eV, a gradual reduction in photoelectron emission intensity is not observed regardless of time passage. It is understood based on the observation that photoelectron emission except for the photoelectron emission of the photo-excited electron by the pump light occurs. Further, since the photoelectron emission continues regardless of time passage, the influence of charging of the sample becomes dominant.

Figure 11:
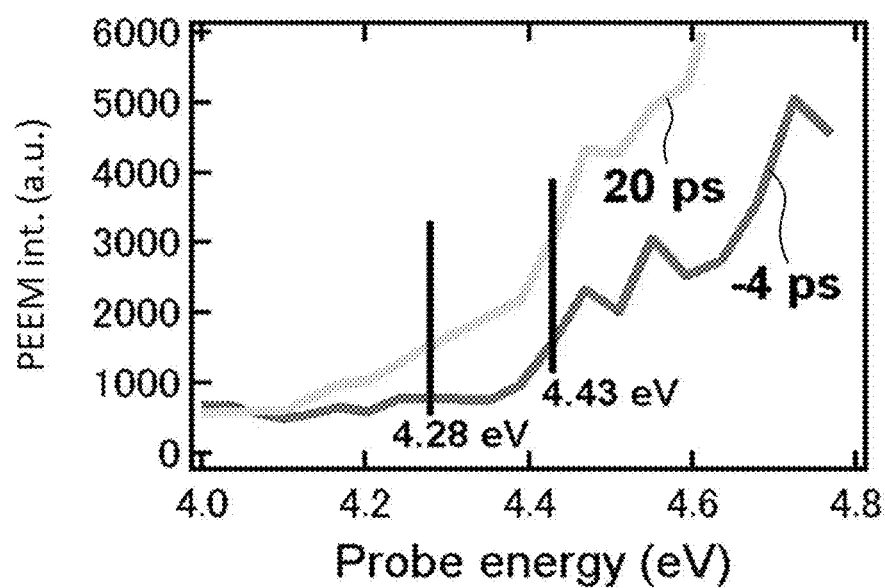
FIG. 11 is a diagram showing a relationship between the energy of probe light pulse and photoelectron emission intensity extracted from FIG. 10A and FIG. 10B when delay time is fixed.

FIG. 11 is a graph representing the relationship between the energy of the probe light and the photoelectron emission intensity when the delay time is fixed to 20 ps and −4 ps, wherein the graph is extracted from the graphs in FIG. 10A and FIG. 10B. The vertical axis in FIG. 11 represents the local photoelectron emission intensity in the photoemission electron microscopic image in arbitrary units and the horizontal axis represents the energy of the probe light. As shown in the graph, the detected intensity of PEEM rises suddenly after the energy of the probe light reaches 4.4 eV in the curve of −4 ps. Thus, the local work function of this sample may be estimated to 4.4 eV. Further, as shown the curve of 20 ps, the photo-excited carrier can be detected by setting energy less than or equal to the measured work function.

Figure 12:
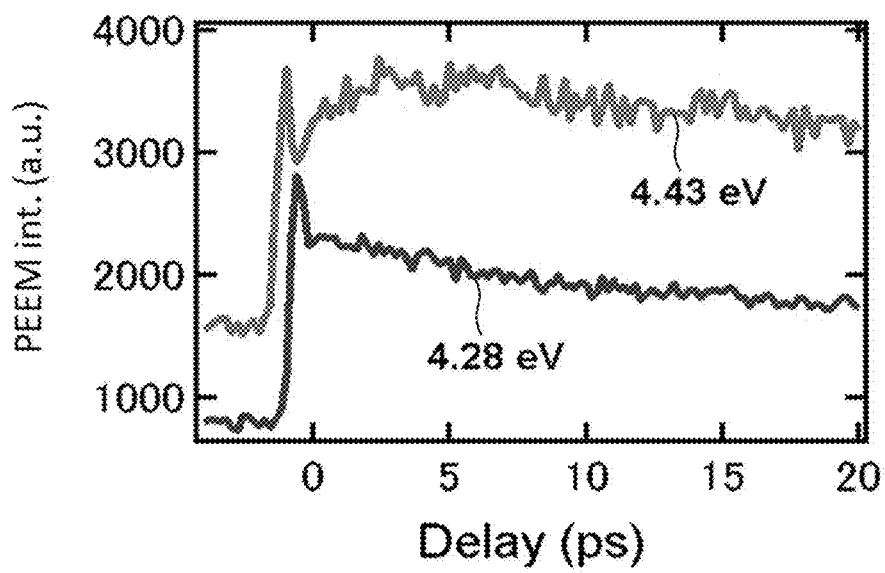
FIG. 12 is a diagram showing a relationship between delay time and photoelectron emission intensity extracted from FIG. 10A and FIG. 10B when the energy of probe light pulse is fixed.

FIG. 12 is a graph extracted from the graph in FIG. 10A and FIG. 10B similar to FIG. 11, and is a graph representing the relationship between the delay time and the PEEM intensity when the energy of the probe light is set to 4.43 eV and 4.28 eV, which are upper and lower than 4.4 eV of the work function, and 4.43 eV. The vertical axis in FIG. 12 represents the local photoelectron emission intensity in a photoemission electron microscopic image in arbitrary units and the horizontal axis represents the delay time in ps.

As seen in the graph in FIG. 12, when the n-type GaAs sample is irradiated with the probe light having an energy of 4.28 eV, slightly lower than 4.4 eV of the work function, the photoelectron emission intensity decreases gradually from the peak value in accordance with time passage. Thus, it is understood that an image having high S/N ratio is obtained in the observation of the photoelectron emission intensity when the energy of the probe light is set to 4.28 eV.

On the other hand, when the n-type GaAs sample is irradiated with the probe light of 4.43 eV, slightly higher than the work function, no relaxation in the PEEM intensity is observed, and it is understood that the influence of charging of the sample is dominant. Further, the background intensity with the probe light of 4.43 eV is higher than the background intensity the probe light of 4.28 eV. Thus, it is understood that the S/N ratio of the observed image becomes low.

As above, although the difference is as low as 150 meV with the work function being sandwiched in between, the difference between 4.28 eV and 4.43 eV of the energy of the probe light is large in the observation, and therefore 4.28 eV, which is a value slightly lower than the work function, should be selected as the energy of the probe light in order to obtain a vivid photoemission electron microscopic image for observation of carrier dynamics. The reason is understood as follows.

Figure 13:
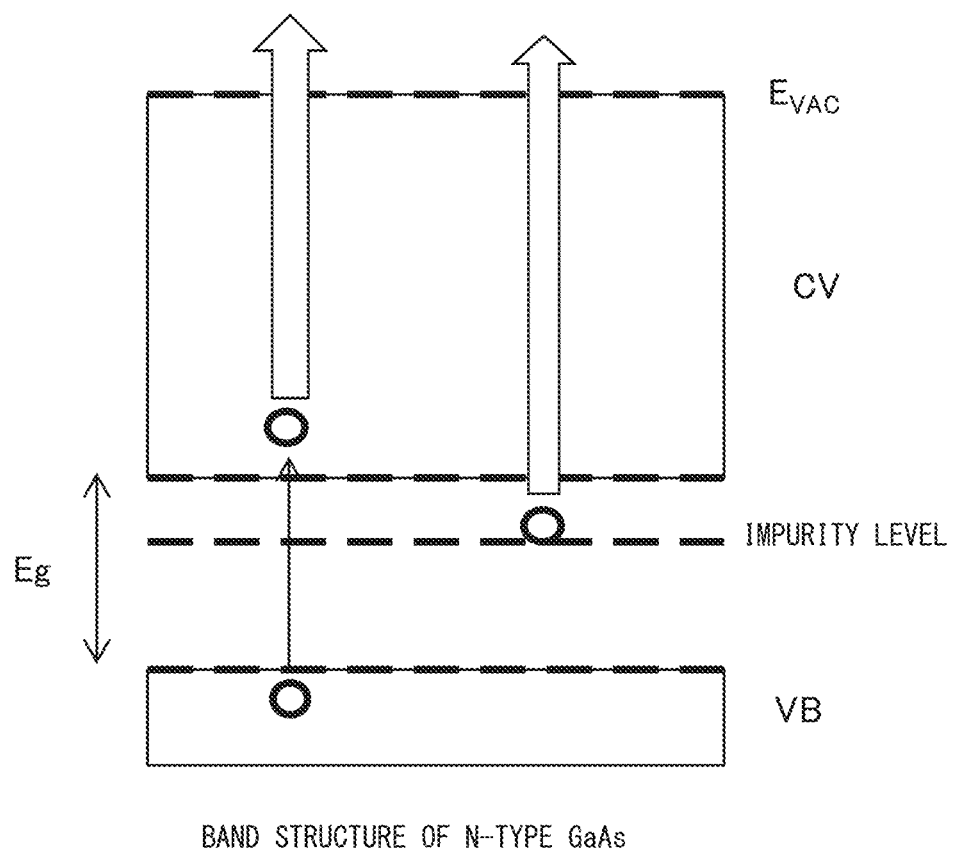
FIG. 13 is a diagram showing a band structure of n-type GaAs.

FIG. 13 is a diagram showing the band structure of n-type GaAs. In FIG. 13, VB indicates a valence band, CB indicates a conduction band, and Eg indicates a band gap. The n-type GaAs has an impurity level under the conduction band. When a sample is irradiated with the probe light of, for example, 4.43 eV, which is an energy slightly higher than the work function of the n-type GaAs, by the irradiation of the pump light, carriers that is located at the impurity level and does not contribute to the dynamic characteristic is emitted as a photoelectron in addition to carriers excited from the valence band to the conduction band, and it is understood that carriers located at the impurity level increase the background in the photoelectron emission intensity and reduce the S/N ratio by inducing charging of the sample.

On the other hand, when the sample is irradiated with the probe light whose energy is an energy slightly lower than the work function of the n-type GaAs, for example, 4.28 eV, carriers at the impurity level is not emitted as a photoelectron and only carriers excited from the valence band to the conduction band by the pump light is emitted as a photoelectron. Thus, charging of the sample is reduced and the photoelectron emission intensity in accordance with time passage is observed with a high S/N ratio.

The energy difference between the conduction band and the vacuum level is the electron affinity (ionization energy). Thus, it is preferable to select a value slightly lower than the work function, for example, a value in the vicinity of the electron affinity (ionization energy) as the energy of the probe light, in order to obtain a vivid photoemission electron microscopic image with a high S/N ratio by emitting only the desired electron, for example, only the photo-excited electron as a photoelectron, and suppressing charging of the sample.

Based on the results of the third embodiment, an electronic computer, not shown schematically, measures the PEEM intensity by varying the energy of the probe light in a wide range in the time-resolved photoemission electron microscopy 101, in order to obtain a vivid image of the carrier dynamics. For example, the computer gives a command to vary continuously the energy of the probe light in a range within ±3 eV with respect to the electron affinity or the work function of the sample. Next, the computer finds the work function of the target area of the sample from the PEEM intensity measured by varying the energy of the probe light. The computer finds the local work function of the sample from the energy at which the PEEM intensity rises when the energy of the probe light is varied. Next, the computer determines a value in accordance with the found work function as the energy of the probe light. The computer selects a plurality of values including a value lower than the found work function and a value higher than the found work function as the energies of the probe light, and observes the PEEM intensity by each energy as time elapses, and then, determines the energy whose influence of charging is estimated to be small as the energy of the probe light when acquiring the PEEM image. Then, the computer acquires the PEEM image by the determined energy of the probe light as, for example, shown in FIG. 2A.

Fourth Embodiment: Depth-Resolved Measurement

Figure 14:
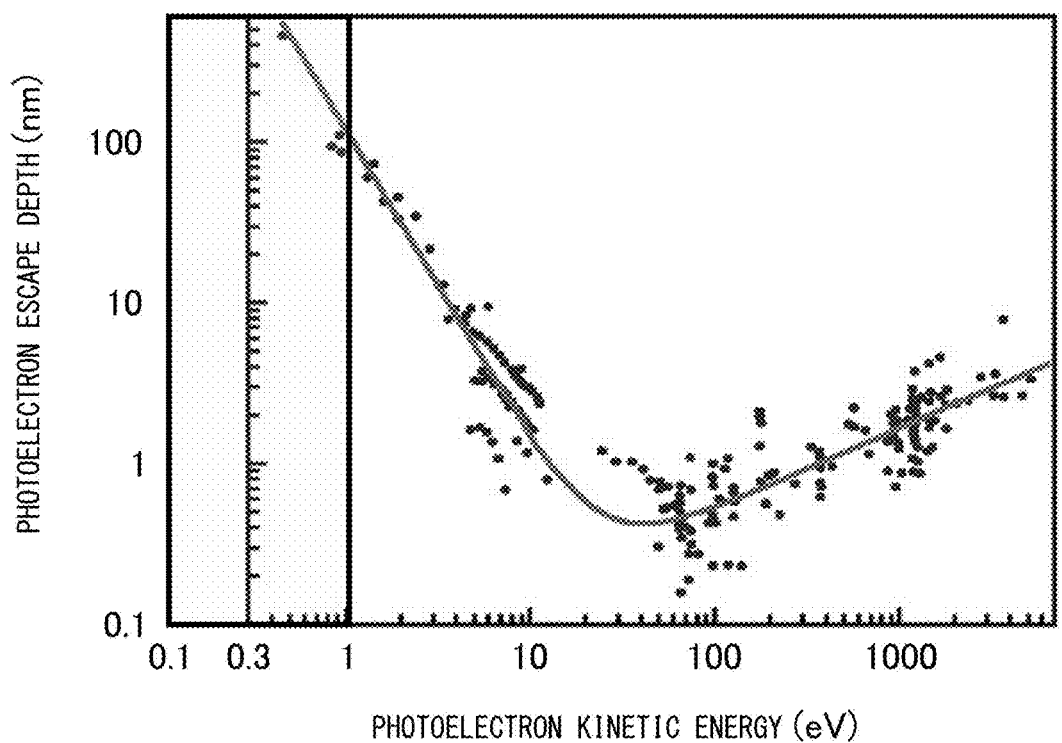
FIG. 14 is a diagram showing a universal curve.

FIG. 14 is a universal curve indicating a relationship between the photoelectron kinetic energy and the photoelectron escape depth. In FIG. 14, the vertical axis represents the photoelectron escape depth in nm and the horizontal axis represents the photoelectron kinetic energy in eV. The escape depth indicates the position in the depth direction of a sample, from which electrons emitted as photoelectrons from the sample comes out. It is known that the relationship between the kinetic energy and the escape depth of electrons emitted as photoelectrons is constant irrespective of material and what indicates this relationship is the universal curve.

The kinetic energy of electrons emitted as photoelectrons is a value obtained by subtracting the electron affinity (ionization energy) or the work function of the target sample from the energy of the probe light. Thus, the kinetic energy of electrons emitted as photoelectrons may be controlled by adjusting the energy of the probe light. In other words, the depth at which electrons escapes from the sample may be controlled, by controlling the energy of the probe light.

For example, when the carrier dynamics of electrons located at a depth down to 100 nm from the sample surface is measured, it is sufficient to adjust the energy of the probe light so that the kinetic energy of emitted photoelectrons is about 1 eV by referring to FIG. 14. Further, when the dynamics of electrons located at a depth of 100 nm or deeper is measured, it is sufficient to adjust the energy of the probe light so that the kinetic energy of emitted photoelectrons is about 3.0 eV by referring to FIG. 14.

As above, information on the inside (bulk) of an target sample may be selectively detected, by adjusting the energy of the probe light.

The invention claimed is:

1. A time-resolved photoemission electron microscopy comprising:
    a laser light source that outputs a pulse having less than or equal to a femtosecond level pulse width and variable repetition frequency;
    a pump light pulse generator configured to generate pump light pulse that excites photo-carriers of a sample by converting wavelength of light output from the laser light source; and
    a probe light pulse generator configured to generate probe light pulse that photo-emits photo-carriers excited by the pump light pulse from the sample by photoelectric effect by converting wavelength of light output from the laser light source, wherein
    energy of at least one of the pump light pulse and the probe light pulse is configured to continuously vary in a range not less than 0.1 eV and not more than 8 eV.

2. The time-resolved photoemission electron microscopy according to claim 1, wherein the probe light pulse generator is configured to continuously vary energy of the probe light pulse.

3. The time-resolved photoemission electron microscopy according to claim 2, wherein the probe light pulse generator has an optical parametric amplifier that converts wavelength of light output from the laser light source.

4. The time-resolved photoemission electron microscopy according to claim 2, wherein the probe light pulse generator further has a high-order harmonic generation device that generates the probe light pulse from light whose wavelength is converted by an optical parametric amplifier.

5. The time-resolved photoemission electron microscopy according to claim 2, wherein a range in which the probe light pulse generator is configured to vary energy is within ±3 eV with respect to an electron affinity, ionization energy, or work function of an observation-target sample.

6. The time-resolved photoemission electron microscopy according to claim 2, further comprising:
    a focus lens stage that keeps constant a focus position and a size of the probe light.

7. The time-resolved photoemission electron microscopy according to claim 6, wherein the condensing lens stage has a focus lens and a drive element that moves a position of the focus lens.

8. The time-resolved photoemission electron microscopy according to claim 1, wherein the pump light pulse generator is configured to continuously vary energy of the pump light pulse.

9. The time-resolved photoemission electron microscopy according to claim 2, wherein the laser light source has a first laser light source that outputs light to the pump light pulse generator, a second laser light source that outputs light to the probe light pulse generator, and a timing control device that controls timing at which the first laser light source and the second laser light source output light.

10. A method of acquiring a photo-excited carrier dynamics image by using a time-resolved photoemission electron microscopy that observes photo-carriers emitted from a sample by irradiating the sample with pump light pulse to excite the photo-carriers of the sample and irradiating the sample with probe light pulse to photo-emit the photocarriers excited by the pump light pulse from the sample by photoelectric effect, comprising steps of:
  varying continuously energy of the probe light pulse in a range within ±3 eV with respect to an electron affinity or work function of the sample;
  measuring photoelectron emission intensity;
  finding the work function of a target area of the sample from a variation over time in the photoelectron emission intensity;
  determining a value in accordance with the found work function as the energy of the probe light; and
  acquiring the carrier dynamics image by the determined probe light energy.

11. A method of acquiring a photo-excited carrier dynamics image by using a time-resolved photoemission electron microscopy that observes photo-carriers emitted from a sample by irradiating the sample with pump light to excite the photo-carriers of the sample and irradiating the sample with probe light to photo-emit the photo-carriers excited by the pump light from the sample by photoelectric effect, comprising step of:
  varying continuously energy of the probe light in a range within ±3 eV with respect to an electron affinity or work function of the sample; and
  measuring photoelectron emission intensity.

\* \* \* \* \*